(12) United States Patent
Nagin et al.

(10) Patent No.: US 6,275,964 B1
(45) Date of Patent: Aug. 14, 2001

(54) SOFTWARE ENHANCED ERROR CORRECTION MECHANISM IN A DATA COMMUNICATION SYSTEM

(75) Inventors: Kenneth Nagin, D.N. Nazareth ilit; Dafna Sheinwald, Nofit; Julien Satran, Haifa, all of (IL); Efri Zeidner, Palo Alto, CA (US); Benny Rochberger, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/272,994

(22) Filed: Mar. 20, 1999

(30) Foreign Application Priority Data

Mar. 20, 1998 (EP) .................................................. 98480015

(51) Int. Cl.$^7$ ...................................................... G06F 11/00
(52) U.S. Cl. ........................................... 714/746; 714/785
(58) Field of Search ..................................... 714/746, 761, 714/762, 785, 781

(56) References Cited

U.S. PATENT DOCUMENTS 5,659,557 * 8/1997 Glover et al. .
5,742,599 * 4/1998 Lin et al. .
5,875,200 * 2/1999 Glover et al. .

* cited by examiner

Primary Examiner—Phung M. Chung
(74) Attorney, Agent, or Firm—Douglas W. Cameron; Anne Vachon Dougherty

(57) ABSTRACT

Data communication system for transmitting data codewords of n bytes length over a communication channel (20) from a transmitter (10) comprising a hardware encoder (12) capable of receiving as input an information sequence of n−2t bytes and emitting as output a codeword of n bytes including n−2t information bytes and 2t redundant bytes to a receiver (24) comprising a hardware decoder (28) capable of detecting up to 2t byte-errors and correcting up to t byte errors; the transmitter (10) further comprising a software encoder (14) transforming, in combination with the hardware encoder (12), an information sequence of n−2s bytes with $t < s \leq 2t$ into a modified sequence, the transmitter (10) emitting encoded codewords including n−2s information bytes and 2s redundant bytes, and the receiver (24) further comprising a software decoder (34) for correcting up to s byte-errors when the hardware decoder (28) has detected errors in the encoded codeword received from the communication channel (20).

8 Claims, 3 Drawing Sheets

SOFTWARE ENHANCED ERROR CORRECTION MECHANISM IN A DATA COMMUNICATION SYSTEM

TECHNICAL FIELD

The invention relates to the detection and correction of errors occurring in data codewords which are transmitted over a communication channel and in particular a mechanism of software enhanced error correction in a data communication system.

BACKGROUND

In a data communication system, reliability in transmission of sequences is achieved at the cost of redundancy, which decreases that rate of information transmission, and complexity, which is added to both sides—transmitter and receiver. In block codes, the sequence of information bytes is first broken up to k-byte long segments, and then each is augmented by n−k redundancy bytes, which depend on the k information bytes. The redundant bytes ensure minimum Hamming distance between the n-byte long codewords, a distance which allows error detection and correction.

Hardware components for error detection/correction (aka CRC—cyclic redundant code) are inexpensive and widely used. Different components offer different error detection and correction capabilities. Some of these components work on bits, and they can detect/correct up to a fixed number of bit errors that occur to the codeword while on transmission, and some work on bytes, and they are more suitable for channels which tend to corrupt the transmission in bursts. On the transmitter side, the component computes, very fast, the redundancy bytes of the codeword, and on the receiver side it checks, very fast, whether the word received is a codeword. If so, the component truncates the redundancy bytes and forwards the information bytes on the application. If not, either it just asks for a retransmission (in case that detection only is employed) or it tries to correct the errors, and then forwards the (corrected) information bytes on to the application. In any case, the application sees the channel and the hardware as one fast and reliable (to some extent) unit which transmits k-byte long segments of information.

When the application wishes to further protect itself against channel errors, the commonly used practice is to make that protection within the k-byte long segment: view them as blocks crossing the channel, use k'<k bytes for information, and compute, in software, the k−k' redundancy bytes. In this practice, the total number of redundancy bytes used (by the hardware and by the software) usually exceeds what can be achieved by a code designed to work with blocks of length n, out of which only k' are information bytes.

A commonly used hardware that detects up to 2t byte-errors and corrects up to t byte-errors is using Reed Solomon codes. These codes are over an alphabet size of $2^m$ and use codewords of length $n=2^m-1$ or a divisor of that number. For instance, in case of byte characters, the codewords are of length 255 bytes. For detecting up to t byte-errors, t redundant bytes must be used allowing 255−t information bytes. For correcting up to t corrupted bytes, 2t redundant bytes must be used, allowing 255−2t information bytes in each codeword. These numbers of redundant bytes are the minimum possible in any code.

Assuming that t does not suffice for the level of noise of the channel and it becomes necessary to enhance the perceived data reliability of the system by increasing the reliability of the channel such that it introduces fewer errors or by increasing the error correction capability of its detection/correction code. One solution would be to replace the whole hardware. Although hardware is not too expensive, it is rather cumbersome to stick it when the level of noise changes rather often. For instance, replacing a wireless connection in a mountainous region or even in a city with a coax cable would be very expensive. An alternative would be to upgrade the error detection and correction capabilities of the encoders and decoders. But, when the hardware encoders and decoders are used, this solution also may be too expensive, since hardware development costs are directly related to the complexity introduced by error detection and correction capability of the encoders and decoders. In addition, replacing existing hardware with enhanced hardware is also expensive and not always practical. For instance, replacing the network receiver card, e.g. modem, in thousands of home PCs with a new enhanced card is a very expensive proposal.

SUMMARY OF THE INVENTION

It is why the main object of the invention is to provide an error detecting and encoding mechanism which increases the system perceived data reliability without raising hardware costs.

Another object of the invention is to provide an error detecting and correcting mechanism wherein the correcting capability is extended by software means only.

Accordingly, the invention relates to a data communication system for transmitting data codewords of n bytes length over a communication channel from a transmitter to a receiver, the transmitter comprising a hardware encoder capable of receiving as input an information sequence of n−2t bytes and emitting in output a codeword of n bytes including n−2t information bytes and 2t redundant bytes, and the receiver comprising a hardware decoder capable of detecting up to 2t byte-errors and correcting up to t byte errors. The transmitter further comprises a software encoder transforming, in combination with the hardware encoder, an information sequence of n−2s bytes with $t<s\leq2t$ into a modified sequence, the transmitter emitting encoded codewords including n−2s information bytes and 2s redundant bytes, and the receiver further comprises a software decoder for correcting, in combination with the hardware decoder, up to s byte-errors when the hardware decoder has detected errors in the encoded codeword received from the communication channel.

An important feature of the invention is that the hardware decoder included in the receiver comprises a switch enabling an encoded codeword to be transferred to the software decoder for being corrected if there are less than s errors after the hardware decoder has detected errors in the encoded codeword.

The new mechanism according to the invention allows easy adaptation to the level of noise in the channel. The total number of redundancy bytes used, by the hardware and by the software extension, is the minimal possible by any error correcting code having the extended capabilities. The suggested mechanism benefits from the speed of hardware, and calls for software decoding only in cases that the hardware decoder detects errors.

BRIEF DESCRIPTION OF THE DRAWINGS

The objects, features and other characteristics of the invention will become more apparent from the following detailed description with reference to the accompanying drawings in which.

DETAILED DESCRIPTION OF THE INVENTION

Figure 1:
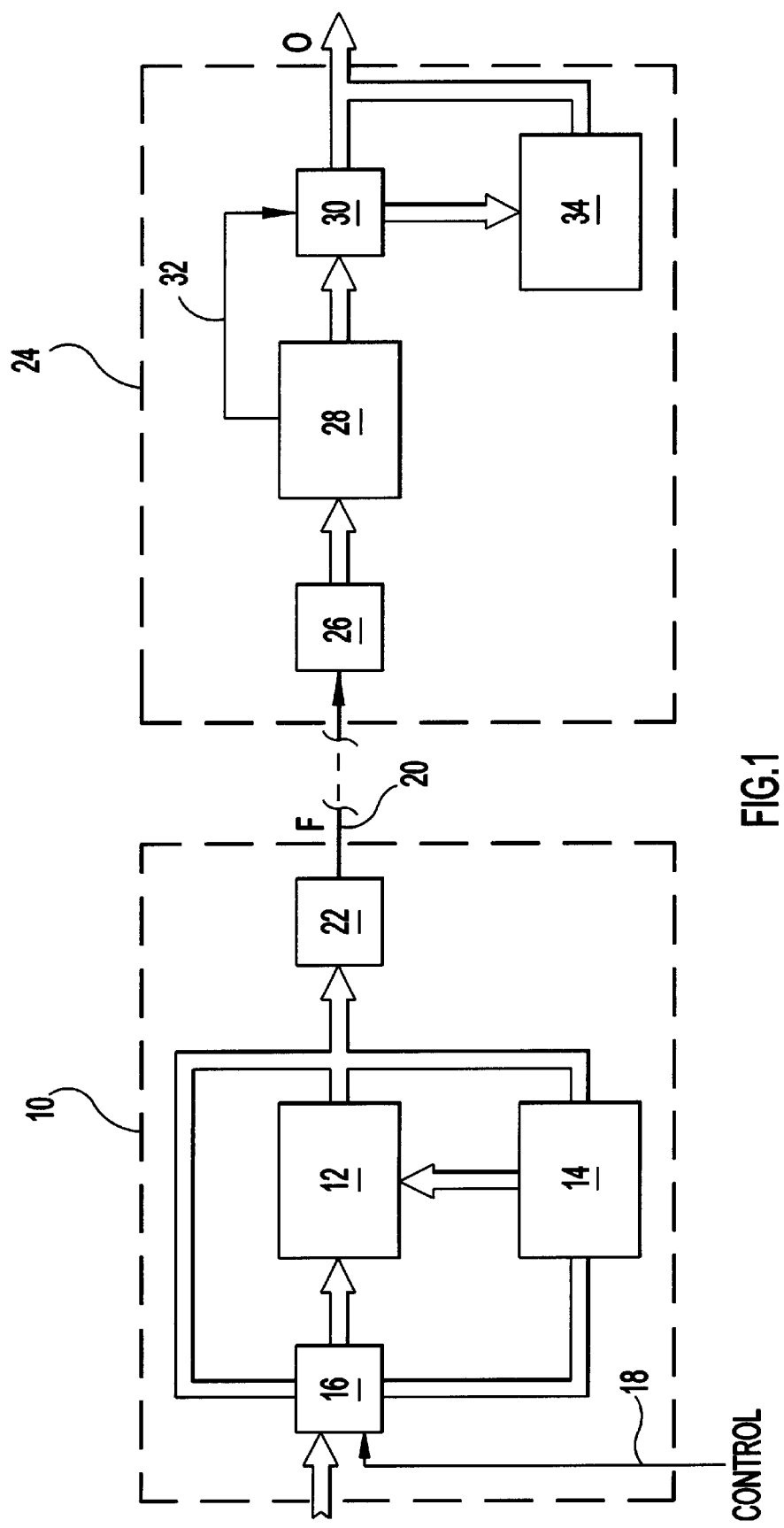
FIG. 1 represents a block-diagram of a data communication system incorporating a mechanism of software enhanced error correction according to the invention.

According to the preferred embodiment of the invention, a Reed Solomon (RS) Code using codewords of length n=255 will be used in the following description. Note that a description of the circuits needed for encoding and decoding RS codes can be found in <<Error correcting codes>> by W. W. Peterson and E. J. Weldon in MIT Press, 1972.

The transmitter 10 contains two encoders. Hardware encoder 12 is a classical encoder which normally transforms an information sequence of 255−2t bytes into a codeword of 255 bytes wherein the 2t supplementary bytes are redundant bytes enabling 2t-byte error detecting and t-byte error correcting. Software encoder 14 which feeds into hardware encoder is used to transform, in combination with hardware encoder 12, 255−2s information bytes with t<s≦2t, into a sequence of 255 bytes wherein 2s redundant bytes enable 2t-byte detecting and s-byte correcting.

The sequences I of information bytes are first fed into switching unit 16 which, under control received from a processor on line 18, enables information bytes to be input either into software encoder 14 or into hardware encoder 12, or simultaneously to be input into hardware encoder 12 and to bypass said hardware encoder as explained hereafter. At the output of hardware encoder 12, the encoded sequences F of 255 bytes are transmitted over communication channel 20 by the intermediary of transmitting interface unit 22.

At the receiving side of communication channel 20, receiver 24 comprises receiving interface unit 26 which provides the encoded information bytes to hardware decoder 28. If there is no error detected, switching unit 30 controlled by hardware decoder 28 on line 32 enables the 255−2s information bytes out of the 255 byte long encoded sequence F to be transmitted directly to the application. If errors have been detected, hardware decoder 28 controls switching unit 30 for it to transfer the bytes to software decoder 34 for correcting such errors if it is possible. Then, the corrected information bytes O are transmitted directly to the application by software decoder 34.

Encoding Process

First of all, it must be reminded that, in the Reed Solomon (RS) 2t-byte error detecting and t-byte error correcting code C, the generator polynomial is $$g(x)=(x-\alpha)(x-\alpha^2)\ldots(x-\alpha^{2t})$$

with $\alpha$ being a primitive element in the finite field GF (256). This code is made from all the 255−byte long words ($c_{254}$, $c_{253}$, ... $c_1$, $c_0$) such that the polynomial $$c(x)=\sum_{j=0}^{254}c_j x^j$$

is a multiplication of g(x) and some polynomial of degree<255−2t.

Accordingly, $$g_1(x)=g(x).g'(x)=(x-\alpha)(x-\alpha^2)\ldots(x-\alpha^{2s})$$

with s>t, is the generator polynomial of the RS code $C_1$ that can correct up to s byte-errors. It must be noted that $g_1(x)$ is a multiplication of g(x).

Without the software encoder according to the invention, hardware encoder 12 would receive an information sequence of 255−2t bytes $$I=i_{254-2t}, i_{253-2t}, \ldots, i_1, c_0$$

and would emit a codeword of length 255

$$c=c_{254}, c_{253}, \ldots c_1, c_0$$

where $c_{j+2t}=i_j$ for $0\leq j\leq 254-2t$
and the last 2t bytes of c are the redundant bytes making the polynomial c(x) a multiple of g(x).

The computation of the redundant bytes is done using a linear feedback switching circuit of 2t storage devices, wired so as to multiply its input by $x^{2t}$ and divide it by g(x). When the circuit is fed by $i_{254-2t}, i_{253-2t}, \ldots, i_0$, in this order, after 255−2t feeding shifts, it contains the reminder r(x) from the division of $i(x).x^{2t}$ by g(x) where $$i(x)=\sum_{j=0}^{254-2t}i_j x^j$$

The degree of r(x) is less than 2t, and all the coefficients of degree less than 2t in the polynomial $i(x).x^{2t}$ are 0. Hence, in the polynomial $c(x)=i(x).x^{2t}+r(x)$ the leading 255−2t coefficients are the 255−2t of i(x), and the trailing 2t coefficients are the coefficients of r(x). Also, by its construction, and because in GF(256) subtracting is the same as addition, c(x) is a multiplication of g(x), and thus a codeword in C.

The hardware encoder alone would work as follows:
(1) for 255−2t clock ticks, $i_{254-2t}, i_{253-2t}\ldots, i_0$ are fed into the circuit and simultaneously also transmitted over the communication channel;
(2) the feedback of the circuit is disabled, and for 2t clock ticks the circuit's contents are shifted out and transmitted over the communication channel.

Now, with the incorporation of software encoder 14, the information sequence received at the input is:

$$I=i_{254-2s}, i_{253-2t}, \ldots, i_1, i_0$$

of length 255−2s. Such a sequence will be transformed into a codeword in $C_1$. Following the classical algorithm as described above, it is necessary to divide by $g_1(x)$ the polynomial $i(x).x^{2s}$ where $$i(x)=\sum_{j=0}^{254-2s}i_j x^j$$

Figure 2:
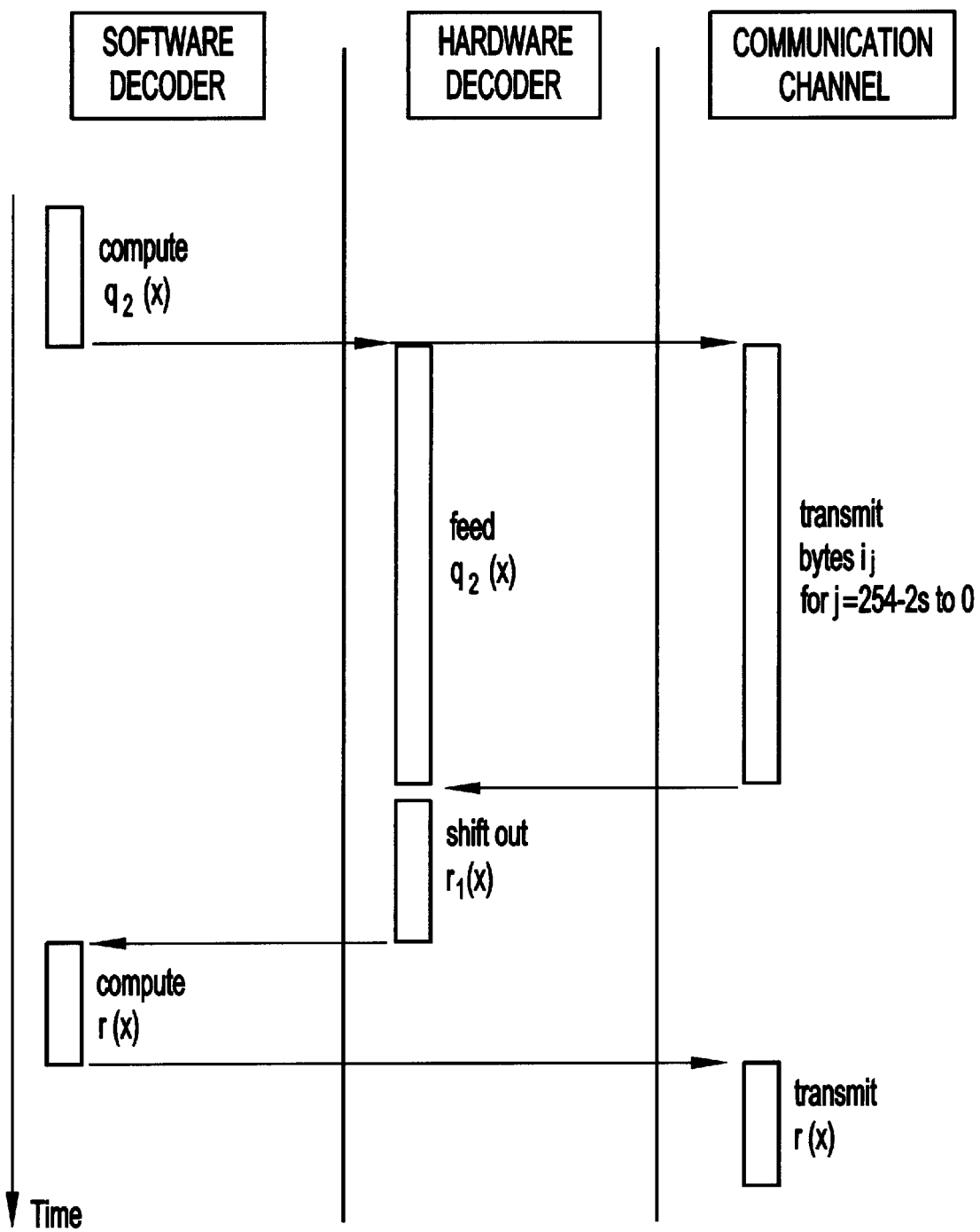
FIG. 2 is a schematic time diagram representing the sequential steps of the encoding algorithm according to the invention.

As illustrated in the time diagram in FIG. 2, the steps of the encoding process are the following:
(1) In software, compute the quotient $q_2(x)$ (of degree≦254−2s) and the remainder $r_2(x)$ (of degree<2s−2t) of the division of $i(x) \cdot x^{2s-2t}$ by $g'(x)$ (which is of degree 2s–2t). This costs $0((2s-2t)(n-2s))$ software scalar operations.

(2) For 255–2s clock ticks, feed $q_2(x)$ to the hardware, and simultaneously transmit $i_{252-2s}, i_{253-2s}, \ldots, i_1, i_0$ over the communication channel. At the end of this transmission, the hardware encoder contains $r_1(x)$ (of degree<2t), such that for some $q_1(x)$ of degree $\leq 254-2s$, it holds that $q_2(x) \cdot x^{2t} = q_1(x)g(x) + r_1(x)$.

(3) For 2t more clock ticks, shift $r_1(x)$ out of the circuit. Do not transmit it over the communication channel yet.

(4) In software, compute $r(x) = r_1(x) \cdot g'(x) + r_2(x) \cdot x^{2t}$. This takes $0(t^2)$ software scalar operations, and yields a polynomial of degree<2s.

(5) Then, in 2s clock ticks, transmit the polynomial computed over the communication channel.

The word transmitted $\in C_1$ since altogether $i(x) \cdot x^{2s} = i(x) \cdot x^{2s-2t} \cdot x^{2t} = q_2(x)g'(x) \cdot x^{2t} + r_2(x) \cdot x^{2t} = (q_1(x)g(x) + r_1(x)) \cdot g'(x) + r_2(x) \cdot x^{2t} = q_1(x)g(x)g'(x) + r_1(x) \cdot g'(x) + r_2(x) \cdot x^{2t} = q_1(x) j_1(x) + r(x)$. The degree of $r(x)$ is <2s, and the least significant 2s coefficients of $j(x) \cdot x^{2s}$ are all zero. Hence, by construction, the total of what is transmitted over the communication channel is $c(x) = i(x) \cdot x^{2s} + r(x)$ which is a multiplication of $g_1(x)$, and hence $\in C_1$, and its most significant 255–2s coefficients are $i_{254-2s}, i_{253-2s}, \ldots, i_1, i_0$.

Note that the whole computation costs 255 clock ticks plus $0(2(s-t)n+t^2)$ software operations; that is mainly, only the addition to fill the gap s–t.

Decoding Process

Without the software decoder according to the invention, hardware decoder 28 would receive a sequence of length n=255 bytes $$F = f_{254}, f_{253}, \ldots f_1, f_0$$

and would divide the corresponding polynomial $$f(x) = \sum_{j=0}^{254} f_j x^j$$

by $g(x)$ and would check whether the remainder is zero. The computation of this division is done as follows.

A linear feedback switching circuit of 2t storage devices is wired so as to divide its input by $g(x)$ (this device is slightly different from the one used by the transmitter's hardware encoder). If the circuit is fed by $f_{254}, f_{253}, \ldots f_0$, in this order, after the 255 feeding clock ticks, it contains the reminder $r_1(x)$ from the division of $f(x)$ by $g(x)$. The quotient polynomial is output by the circuit, but is of no use for the detecting/correcting algorithm.

Now if the remainder $r_1(x)=0$, the decoder declares no errors, removes the 2t redundant bytes, $f_{2t-1}, f_{2t-2}, \ldots f_1, f_0$, and forwards the information bytes $f_{254}, f_{253}, \ldots f_{2t+1}, f_{2t}$, on to the application. If $r_1(x) \neq 0$, the correcting process (of at most t byte errors) starts with computing the syndromes, which are the values of $f(\alpha^1), f(\alpha^2), f(\alpha^{2t})$ Because $g(\alpha^j)=0$ for j=1, 2, ..., 2t, we have $r_1(\alpha^j) = f(\alpha^j)$ for these values of j. The computation of $r_1(\alpha^j)$ is many times easier than $f(\alpha^j)$, because the degree <2t of $r_1(x)$ is much smaller than the degree 254 of $f(x)$. Once the 2t syndromes have been determined, the decoding continues with time complexity that depends on t.

Figure 3:
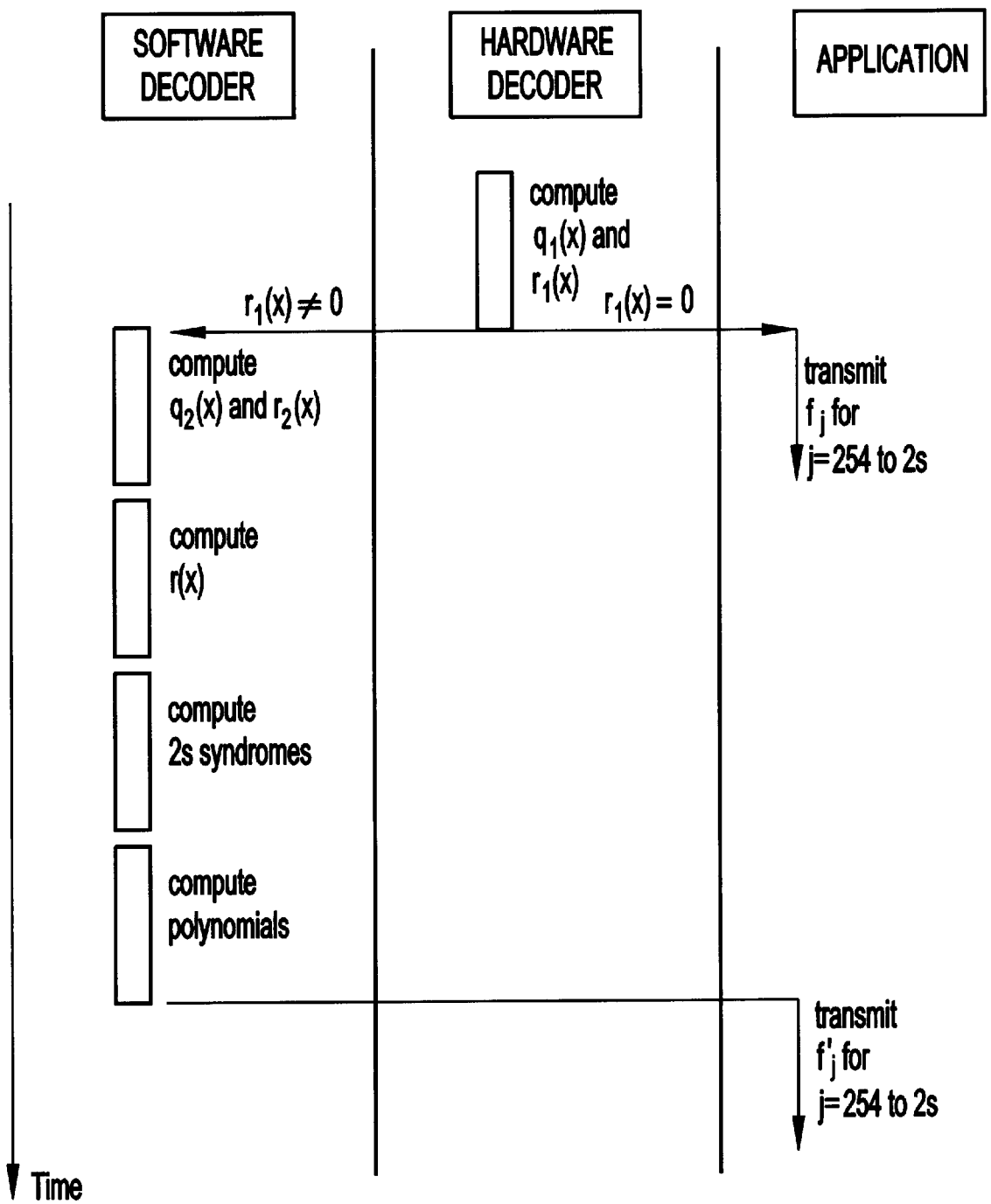
FIG. 3 is a schematic time diagram representing the sequential steps of the decoding algorithm according to the invention.

With the incorporation of software decoder 34, it is necessary to divide $f(x)$ by $g_1(x)$. The steps illustrated by the time diagram of FIG. 3 are then the following:

(1) Feed $f(x)$ into the hardware decoder which divides it by $g(x)$. Keep both the quotient $q_1(x)$ and the remainder $r_1(x)$. That is: $f(x) = q_1(x)g(x) + r_1(x)$, with the degree of f(x) being $\leq 254$, the degree of g(x) is 2t, the degree of $r_1(x)$ is <2t, and the degree of $q_1(x)$ is $\leq 254-2t$. In the classic decoding algorithm, $q_1(x)$ would be of no use, while it is useful for the invention;

(2) If $r_1(x)=0$, declare no errors, transmit the information bytes $O=f_{254}, f_{253}, \ldots f_{2s+1}, f_{2s}$ to the application, and the decoding is complete. Otherwise, continue with error correction as follows;

(3) Using the software decoder, divide $q_1(x)$ by $g'(x)$ (which is of degree 2s–2t), producing the quotient $q_2(x)$ of degree $\leq 254-2s$, and the remainder $r_2(x)$ of degree <2s–2t, satisfying $q_1(x) = q_2(x) \cdot g'(x) + r_2(x)$. This takes $0((n-2t)(2s-2t))$ scalar operations;

(4) Compute $r(x) = g(x) \cdot r_2(x) + r_1(x)$. It is easy to see that the degree of r(x) is <2s, and that it satisfies $f(x) = g(x) \cdot g'(x) q_2(x) + r(x) = q_2(x)g_1(x) + r(x)$.

(5) Compute the 2s syndromes $r(\alpha), r(\alpha^2) \ldots r(\alpha^{2s})$;

(6) Then, the error location polynomial and the error value polynomial are computed from the syndromes, and their roots are found.

(7) Finally, the corrected information sequence $O = f'_{254}, f'_{253}, \ldots f'_{2s+1}, f'_{2s}$ is transmitted to the application.

Steps 5 and 6 are of complexity which depends on s (and therefore on t). Depending on the exact structure of the hardware decoder of C, the correction of the codeword with respect to $C_1$ can benefit from computation it does, as it was done for the division of f(x) by g(x).

The Decoder Switch

An important feature is the presence of a switch in hardware decoder 28 which turns the decoder's correction efforts off and only lets it do detection. It is useful to explain this point in more details and the interest thereof.

As mentioned above, the hardware recognizes a code C, witch is a super set of the code, $C_1$, used by the combined hardware and software decoders. Any two words of $C_1$ differ from one another by (the Hamming distance between them) at least 2s+1 bytes, and this is why correction of up to s byte-errors is possible. Any two words of C are of 2t+1 distance apart, and this is why the hardware can detect up to 2t (which is $\geq$s) byte-errors occurring on transmission. There are words in C–$C_1$ which are 2t+1 apart from words in $C_1$. If the hardware decoder is allowed to do corrections, it can complete successfully. Namely, seeing codeword in C which is within distance t from the received word, it might mistakenly correct a word, yielded from a word in $C_1$ by t+1 byte-errors (a number of errors which the combined system is supposed to correct successfully), to a closer word in C–$C_1$, which is only t bytes away. The decoder then will declare the (mistakenly) corrected word it produces is an OK word, and thus will not invoke the software correction, and transfer on to the application an erroneous information subword. If, however, the hardware decoder is not tempted to correct the received erroneous word, and only announces that it has detected an error, the software decoder, which can correct any number $\leq$s of byte errors, will find the original word in $C_1$, which is within distance t+1$\leq$s from the received word.

The Benefits of the Invention

In summary, the system according to the invention (1) can increase the correction capability up to twice the number of erroneous bytes that the hardware can correct, (2) uses the encoder and decoder hardware to speed up encoding and decoding, and (3) uses the minimum needed extra redundant bytes: namely, fixing the numbers 2t$\geq$s>t of byte errors, the number of redundancy bytes in the hardware code is the minimal possible for any t-error correcting code, and the total number of redundancy bytes, is the minimum possible in any s-error correcting code.

As consequence, the benefits resulting from such a system are:

(1) Increased network perceived data reliability without added hardware cost:

The addition of software enhanced error correction increases the perceived data reliability since the software decoder corrects more errors than the hardware decoder, and thus application software see fewer uncorrectable data errors. If the software's error correction capability is equivalent to the hardware's error detection capability then the receiver will always (within hardware's dectection capability) succeed in correcting data and the software application will never have to handle uncorrectable data errors. Extra hardware cost is avoided since the network's error correction capability is increased without changing the hardware encoder or decoder to handle more complex codes or by increasing the channel reliability.

(2) Easy adaptation to noisy channels:

The addition of software enhanced error correction makes it easier to adapt to noisy channels since increasing the error correction capability of software is simpler and cheaper than changing the hardware capability. Also, it is much easier to upgrade existing customer software than to install new hardware in the field.

(3) Efficient Bandwidth utilization:

The addition of software enhanced error correction decreases the probability that data recovery will consume bandwidth. The most common method for recovering from uncorrectable data checks is to retry the read operation. This means that, when the receiver cannot correct a data error, there is a high probability that the receiving software application will request to read the data again thus forcing the transmitter to send the data again over the channel. Obviously, in a noisy channel, the above scenario tends to repeat itself and more bandwidth is allocated to recovery. Since software enhanced error correction increases data correction capability, less bandwidth is allocated to data recovery.

(4) Efficient CPU utilization

The CPU is efficiently utilized since the software enhanced error correction is only run when it is required, i.e. the software decoder only runs when the hardware decoder encounters an error.

All data that is received must be checked for errors, but only a small proportion of the data actually has any data errors. The CPU is used more efficiently since the hardware decoders can check all the good data without using CPU cycles. In addition, the data is processed more quickly since the hardware is designed specifically to decode data.

What is claimed is:

1. Data communication system for transmitting data codewords of n bytes length over a communication channel (20) from a transmitter (10) to a receiver (24), said transmitter comprising a hardware encoder (12) capable of receiving as input an information sequence of n−2t bytes and emitting as output a codeword of n bytes including n−2t information bytes and 2t redundant bytes, and said receiver comprising a hardware decoder (28) capable of detecting up to 2t byte-errors and correcting up to t byte errors;

Said data communication system being characterized in that:

said transmitter further comprises a software encoder (14) transforming, in combination with said hardware encoder, an information sequence of n−2s bytes with t<s≦2t into a modified sequence, said transmitter emitting encoded codewords including n−2s information bytes and 2s redundant bytes, and said receiver further comprises a software decoder (34) for correcting up to s byte-errors when said hardware decoder has detected errors in the encoded codeword received from said communication channel.

2. Data communication system according to claim 1, wherein said hardware decoder (28) in said receiver (24) comprises a switch enabling a codeword to be transferred to said software decoder (34) for being corrected if there are less than s errors after said hardware decoder has detected errors in said codeword.

3. Data communication system according to claim 1 or 2, wherein the error detecting and correcting code being used for encoding said data codewords uses a generator polynomial $$g_1(x)=(x-\alpha)(x-\alpha^2)\ldots(x-\alpha^{2s})$$

that is $$g_1(x)=g(x).g'(x)$$

where $$g(x)=(x-\alpha)(x-\alpha)\ldots(x-\alpha^{2t})$$

and $$g'(x)=(x-\alpha^{2t+1})(x-\alpha^{2s})\ldots(x-\alpha^{2s})$$

with α being a primitive element in the finite field GF(256).

4. Data communication system according to claim 3, wherein said detecting and correcting code is a Reed Solomon code.

5. Data communication system according to claim 4, wherein length n of said codewords is 255 bytes or a divisor of 255 bytes.

6. Process of encoding data codewords (I) in a data communication system according to claim 5, characterized by the steps of:

a) computing by said software encoder (14), the quotient $q_2(x)$ and the remainder $r_2(x)$ of the division of $i(x)$ $.x^{2s-2t}$ by g'(x) in which $$i(x)=\sum_{j=0}^{254-2s} i_j x^j$$

with $i_j$ being each byte of said information sequence input to said transmitter (10), b) for 255−2s clock ticks, feeding $q_2(x)$ to said hardware encoder (12) and simultaneously transmitting ($i_j$) for j=254−2s to 0 over said communication channel (26)

c) for 2t clock ticks, shifting out $r_1(x)$ which is the remainder of the division of $q_2(x).x^{2t}$ by generator polynomial g(x) of said hardware encoder, d) computing by said software encoder, polynomial r(x)= $r_1(x).g'(x)+r_2(x).x^{2t}$, and e) for 2s clock ticks, transmitting the coefficients of said polynomial r(x) over said communication channel.

7. Process of decoding encoded data codewords $F=f_{254}, f_{253}, \ldots, f_1, f_0$ in a data communication system according to claim 5, characterized by the steps of:

a) dividing in said hardware decoder (28), a polynomial $$f(x) = \sum_{j=0}^{254} f_j x^j$$

with $f_j$ being each byte of said encoded codeword, by $g(x)$ in order to obtain a quotient $q_1(x)$ and a remainder $r_1(x)$, and b) transmitting the information bytes $f_{254}, f_{253}, \ldots, f_{2s}$ directly to the application if $r_1(x)=0$.

8. Process according to claim 7, further comprising the following steps carried out by said software decoder (34) if $r_1(x) \neq 0$:

c) dividing $q_1(x)$ by $g'(x)$ for obtaining a quotient $q_2(x)$ and a remainder $r_2(x)$ d) computing $r(x)=g(x).r_2(x)+r_1(x)$ e) computing the 2s syndromes $r(\alpha), r(\alpha^2), \ldots r(\alpha^{2s})$ f) computing an error location polynomial and an error value polynomial from the syndromes in order to recover the corrected codeword when there are less than s errors, and g) transmitting the corrected bytes $f'_{254}, f'_{253}, \ldots f'_{2s}$ to the application.

* * * * *